(12) United States Patent
Iinuma

(10) Patent No.: US 7,078,345 B2
(45) Date of Patent: Jul. 18, 2006

(54) METHOD FOR MANUFACTURING A SEMICONDUCTOR DEVICE

(75) Inventor: Toshihiko Iinuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 10/725,434

(22) Filed: Dec. 3, 2003

(65) Prior Publication Data

US 2004/0266194 A1    Dec. 30, 2004

(30) Foreign Application Priority Data

Jun. 26, 2003   (JP) .............................. 2003-182835

(51) Int. Cl.
*H01L 21/302* (2006.01)

(52) U.S. Cl. ...................... 438/694; 438/655; 438/689; 438/299; 438/300; 438/216; 438/164; 257/332; 257/63; 134/3

(58) Field of Classification Search ................ 438/694, 438/964
See application file for complete search history.

(56) References Cited

U.S. PATENT DOCUMENTS

| | | | |
|---|---|---|---|
| 6,376,343 B1 | 4/2002 | Buynoski et al. | |
| 6,589,829 B1* | 7/2003 | Yamazaki et al. | 438/164 |
| 6,599,370 B1* | 7/2003 | Skee | 134/3 |
| 6,720,617 B1* | 4/2004 | Einav | 257/332 |
| 6,797,614 B1* | 9/2004 | Paton et al. | 438/655 |

OTHER PUBLICATIONS

U.S. Appl. No. 10/725,434, filed Dec. 2003, Iinuma.*
Du Pont Products Sheet; 2004; E.I. DuPont de Numerous and Company.*
Ceria Slurries: Altrnative Slurry for Post CMP Cleams; Maria A. lester, Associate Editor —Semiconductor International, May 1, 2002.*

* cited by examiner

*Primary Examiner*—Nadine G. Norton
*Assistant Examiner*—Patricia George
(74) *Attorney, Agent, or Firm*—Finnegan, Henderson, Farabow, Garrett & Dunner, L.L.P.

(57) ABSTRACT

There is disclosed a method of manufacturing a semiconductor device comprising forming a diffusion region containing arsenic impurity at a concentration of $1\times10^{20}$ cm$^{-3}$ or more in an element region of Si substrate which is isolated by an element isolating insulation film with a gate electrode being employed as a mask, depositing Ni metal all over the substrate, heat-treating the substrate at a temperature of less than 400° C., thereby forming a nickel silicide film containing $Ni_2Si$ on the diffusion region, removing unreacted Ni metal deposited on the element isolating insulation film, heat-treating the substrate at a temperature of 450° C. or more, thereby forming an NiSi film having a arsenic compound layer on the surface thereof, removing the arsenic compound layer by an alkaline liquid, depositing an interlayer insulating film the entire surface of the substrate, and forming a wiring layer piercing through the interlayer insulating film.

19 Claims, 4 Drawing Sheets

METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2003-182835, filed Jun. 26, 2003, the entire contents of which are incorporated herein by reference.

BACKGROUND OF THE INVENTION

1. Field of the Invention

This invention relates to a method for manufacturing a semiconductor device, and in particular, to a method of forming an MIS (Metal Insulator Semiconductor) type FET (Field Effect Transistor) device wherein a nickel silicide film is formed on a portion of the surface of a contact region of source/drain diffusion layer, and to a method of manufacturing an LSI device comprising the FET device.

2. Description of the Related Art

Concomitant with the advancement in miniaturization of semiconductor devices in recent years, there are persistent demands for the miniaturization of not only the dimension of planes parallel with the surface of semiconductor substrate such as the planar dimension of gate of transistor, the width of element isolating insulating film or the width of wirings, but also the dimension in the direction perpendicular to the surface of semiconductor substrate such as the height of a gate electrode or the depth of junction of source/drain contact region. On the other hand, it is also demanded to minimize the parasitic resistance in regions such as the gate electrode and source/drain diffusion layer, which can be realized by the formation of a silicide film having a low electric resistance on the surfaces of these regions. Therefore, it is also required to adopt a so-called SALICIDE (Self-Aligned silicide) process which is designed to form a low electric resistance silicide film on the surface of the gate electrode as well as on the surface of source/drain diffusion layer.

As for the silicide film to be formed on the surfaces of the gate electrode and source/drain diffusion layer, there have been employed a titanium silicide ($TiSi_2$) film or a cobalt silicide ($CoSi_2$) film. However, due to the advancement in miniaturization of semiconductor devices these days, it is now considered more difficult to meet all of the aforementioned demands, so that it is now required to employ a nickel silicide (NiSi) film in place of the aforementioned materials.

The SALICIDE process where NiSi is employed is advantageous in the following respects as compared with the SALICIDE process where $TiSi_2$ or $CoSi_2$ is employed. Namely, the SALICIDE process using NiSi is featured in that: (1) Any increase in sheet resistance can be hardly generated on the occasion of forming the film thereof on the surface of a fine element pattern; (2) It is possible to minimize the permeation of the silicide film into the source/drain diffusion layer; and (3) Since the silicide film can be formed at low temperatures, the inactivation of impurities in the impurity diffusion layer (source/drain diffusion layer or gate polysilicon electrode) of transistor can hardly take place (i.e. it is possible to maintain a high-activation rate).

The conventional method of manufacturing a MOS type FET device where the aforementioned nickel SALICIDE process is employed has been conducted by the process as illustrated by FIGS. 1A to 1F.

First of all, as shown in FIG. 1A, an element isolating insulating film 102 consisting of a silicon oxide film is deposited on the surface of a semiconductor substrate 101. Then, a gate electrode 104 made of polysilicon is formed, via a gate insulating film 103, on the surface of the semiconductor substrate 101, after which an impurity is implanted into the semiconductor substrate 101 to form a first diffusion region 105 on the surface of the semiconductor substrate 101.

Then, as shown in FIG. 1B, a sidewall insulating film 106 is formed on the periphery of the gate electrode 104. Further, by implantation of an impurity, a second diffusion region 107 is formed on the semiconductor substrate 101 and at the same time, the gate electrode 104 is also impregnated with the impurity.

Thereafter, as shown in FIG. 1C, a nickel film 108 is deposited all over the surface of the semiconductor substrate 101.

Then, the resultant body is subjected to a heat treatment for a period not more than 5 minutes at a temperature ranging from 450° C. to 550° C. As a result, the portion of the nickel film 108 which is contacted with the surface of the gate electrode 104 and with the surface of the second diffusion region 107 is converted into a nickel silicide (NiSi) film 109 as shown in FIG. 1D. On the other hand, the portion of the nickel film 108 which deposited on the element isolating insulating film 102 and on the sidewall insulating film 106 is prevented from taking part in the reaction thereof with silicon thereby being permitted to remain as it is.

The unreacted portion of nickel film 108 is then treated with a mixed chemical liquid containing sulfuric acid and an aqueous hydrogen peroxide solution or with a mixed chemical liquid containing an aqueous alkali solution and an aqueous hydrogen peroxide solution, thereby selectively removing the unreacted portion of nickel film 108 as shown in FIG. 1E.

Further, an interlayer insulating film 110 is deposited all over the surface of semiconductor substrate 101, and then, subjected to anisotropic etching by photolithography and RIE (Reactive Ion Etching) to form a contact hole. Finally, as shown in FIG. 1F, by this contact hole, the source, drain and gate electrode of transistor are electrically connected with a wiring layer 111 to accomplish the manufacture of FET device.

The nickel silicide (NiSi) film can be formed on the surface of the source/drain diffusion layer as well as on the surface of gate polysilicon electrode of the MOS type FET device by the nickel salicide process as mentioned above. However, the Ni film deposited on the insulating film would be easily flocculated as it is heat-treated at a temperature of 400° C. or more. Therefore, as indicated by the arrow shown in FIG. 1D, part of the Ni film is permitted to flow into the peripheral portions of the source/drain diffusion layer or of the gate electrode, thereby causing the nickel silicide (NiSi) film to be formed thicker than required. As a result, problems are raised such that the leak current at the junction (junction leak current) in the source/drain diffusion layer is caused to increase or the characteristics of the gate insulating film is caused to deteriorate.

As a result of investigation of the behavior of the flocculation of a nickel thin film (film thickness: 12 nm or less) which was deposited on a surface of silicon oxide film, it was confirmed, through the examination of sheet resistance and SEM observation, that the Ni film was caused to flocculate if the nickel thin film was subjected to heat treatment (RTA treatment) at a temperature of 400° C. or more.

In an attempt to avoid such problems, there has been proposed a method of forming a silicide film by a two-stage heat treatment. Followings are the explanation of this method which will be set forth with reference to FIGS. 2A to 2G.

First of all, according to the procedures illustrated with reference to FIG. 1A, a polysilicon gate electrode 104 is deposited, via the interposition of gate insulating film 103, on the surface of a semiconductor substrate 101 having an element isolating insulating film 102 as shown in FIG. 2A. Then, impurities are introduced into the semiconductor substrate 101 to form a first diffusion region 105. Then, as shown in FIG. 2B, a sidewall insulating film 106 is formed and impurities are introduced into the semiconductor substrate 101 to form a second diffusion region 107. Further, as shown in FIG. 2C, a nickel film 108 is deposited all over the surface of the semiconductor substrate 101.

The semiconductor substrate 101 having the nickel film 108 formed all over the surface thereof is then subjected to heat treatment for 5 minutes or less at a temperature ranging from 250° C. to 400° C. Due to this heat treatment, the nickel film 108 which is contacted with the gate electrode 104 and with the second diffusion region 107 is converted into a nickel-rich nickel silicide film 112 consisting of di-nickel silicide ($Ni_2Si$) or of a mixture of di-nickel silicide ($Ni_2Si$) and nickel monosilicide (NiSi) as shown in FIG. 2D. Since the temperature of this heat treatment is not higher than 400° C., the nickel film 108 that has been deposited on the surface of an insulating film such as the element isolating insulating film 102 and the sidewall insulating film 106 is permitted to remain as an unreacted nickel without being flocculated.

The unreacted portion of nickel film 108 is then treated by using sulfated water or alkalized water to selectively remove it as shown in FIG. 2E.

The resultant semiconductor substrate is further subjected to a heat treatment for a period of five minutes or less at a temperature ranging from 450° C. to 550° C., thereby enabling the nickel-rich nickel silicide film 112 to convert into a nickel monosilicide (NiSi) film 109 as shown in FIG. 2F.

Thereafter, an interlayer insulating film 110 is deposited all over the surface of the semiconductor substrate 101 and then subjected to anisotropic etching such as photolithography and RIE (Reactive Ion Etching) so as to form a contact hole. Finally, as shown in FIG. 2G, by this contact hole, the source, drain and gate electrode of transistor are electrically connected with a wiring layer 111 to accomplish the manufacture of a MOS type FET device.

Due to this two-stage heat treatment, it is possible to form a nickel silicide film which is low in electric resistance and capable of suppressing the generation of not only the junction leak but also the failure of gate insulating film. However, this two-stage heat treatment is accompanied with a problem that when the source/drain diffusion layer or the gate polysilicon electrode contains a high concentration of arsenic impurity, inconveniences are caused to generate in the manufacture of a MOSFET device, thereby making it difficult to manufacture a semiconductor device excellent in reliability.

BRIEF SUMMARY OF THE INVENTION

A method of manufacturing a semiconductor device according to one embodiment of the present invention comprises:

forming a diffusion region by introducing an arsenic impurity into an element region of a silicon substrate, which is isolated by an element isolating insulation film, to a concentration of $1 \times 10^{20}$ $cm^{-3}$ or more with a gate electrode formed over a gate insulating film being employed as a mask;

depositing nickel metal over the entire top surface of the silicon substrate;

heat-treating the silicon substrate having the nickel metal deposited thereon at a first temperature of less than 400° C. while leaving the nickel metal on the surface of the element isolating insulation film, thereby forming a nickel silicide film containing di-nickel silicide ($Ni_2Si$) on a surface of the diffusion region;

removing an unreacted portion of the nickel metal deposited on the element isolating insulation film;

heat-treating the silicon substrate having the unreacted nickel metal removed therefrom at a second temperature of 450° C. or more, thereby forming a nickel monosilicide (NiSi) film having an arsenic compound layer on a surface thereof;

etching away the arsenic compound layer by using an alkaline liquid;

depositing an interlayer insulating film over the entire top surface of the silicon substrate; and forming a wiring layer piercing through the interlayer insulating film.

A method of manufacturing a semiconductor device according to another embodiment of the present invention comprises:

forming a diffusion region by introducing arsenic impurity into an element region of a silicon substrate, which is isolated by an element isolating insulation film, to a concentration of $1 \times 10^{20}$ $cm^{-3}$ or more with a gate electrode formed over a gate insulating film being employed as a mask;

depositing a metal film over the entire top surface of the silicon substrate;

heat-treating the silicon substrate having the metal film deposited thereon at a first temperature of less than 400° C. while leaving the metal film on the surface of the element isolating insulation film, thereby forming a first metal silicide film on a surface of the diffusion region;

removing an unreacted portion of the metal film deposited on the element isolating insulation film;

heat-treating the silicon substrate having the unreacted metal film removed therefrom at a second temperature of 450° C. or more, thereby forming a second metal silicide film having a arsenic compound layer on a surface thereof;

etching away the arsenic compound layer by using an alkaline liquid;

depositing an interlayer insulating film over the entire top surface of the silicon substrate; and forming a wiring layer piercing through the interlayer insulating film.

DETAILED DESCRIPTION OF THE INVENTION

It has been discovered by the present inventors that when silicon of the diffusion region containing a high-concentration of $1 \times 10^{20}$ cm$^{-3}$ or more of arsenic impurity is reacted with nickel metal to form a nickel silicide film, a large quantity of arsenic atom is permitted to precipitate on the surface of the nickel silicide film, thereby forming an arsenic compound layer.

Arsenic impurity is frequently introduced into the source/drain diffusion layer or polysilicon electrode of an n-type MOSFET for the purpose of forming a shallow diffusion layer. Particularly in this case, there is a high possibility of causing an arsenic compound layer to precipitate on the surface of the nickel silicide film. Further, due to the arsenic compound layer thus precipitated, the adhesion of an interlayer insulating film deposited on the surface of silicide film is caused to deteriorate. Moreover, when the cleaning treatment of the bottom of contact hole is performed, the arsenic compound layer precipitated is etched, thereby raising the problem that so-called "pocket" is caused to generate between the interlayer insulating film and the silicide film.

Next, the problems mentioned above will be illustrated with reference to FIGS. 3A and 3E which show an n-type MOSFET element where arsenic impurity is introduced into gate electrode as well as into the second diffusion region.

Figure 3A:
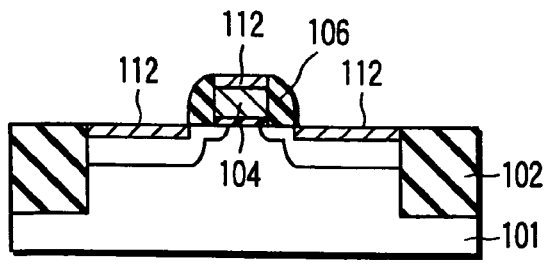
FIGS. 3A to 3E show respectively a cross-sectional view illustrating the problems accompanied with the conventional manufacturing method of MOS type FET device.

FIG. 3A shows a structure which has been obtained through a process shown in aforementioned FIGS. 2A to 2E. As shown in FIG. 3A, a nickel-rich nickel silicide film 112 is formed on the surfaces of the source/drain diffusion layer 107 and polysilicon gate electrode 104 of the MOS polysilicon gate electrode 104 contain, at the upper surface layer thereof, an arsenic compound in a concentration of $1 \times 10^{20}$ cm$^{-3}$ or more.

Figure 3B:
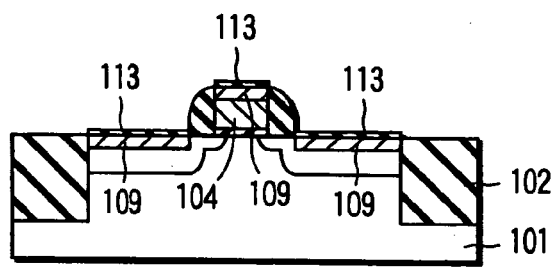

When the nickel-rich nickel silicide film 112 is heat-treated for a period of not more than 5 minutes at a temperature ranging from 450° C. to 550° C., the nickel-rich nickel silicide film 112 is converted into a nickel monosilicide (NiSi) film 109 as shown in FIG. 3B. The arsenic impurity that has been implanted at a high concentration in the gate electrode 104 as well as in the second diffusion layer 107 is permitted to precipitate on the surface of the nickel monosilicide film 109 as a result of the aforementioned heat treatment, thereby forming an arsenic compound layer 113.

Figure 3C:
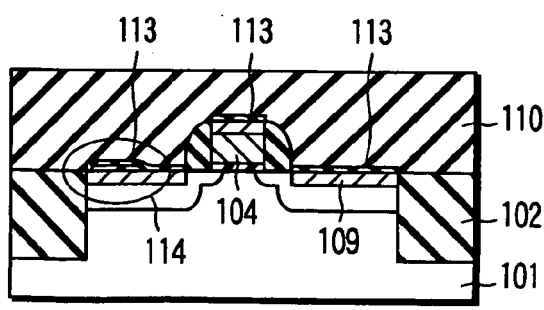

Then, as shown in FIG. 3C, an interlayer insulating film 110 is deposited on the surface of the semiconductor substrate 101 having the nickel monosilicide film 109 formed thereon. On this occasion, due to the membrane stress to be effected by the interlayer insulating film 110, film-peeling 114 may sometimes be caused to generate at the interface between the interlayer insulating film 110 and the arsenic compound layer 113 or at the interface between the arsenic compound layer 113 and the nickel monosilicide film 109.

Figure 3D:
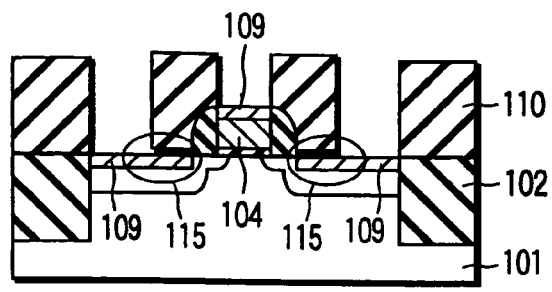

By photolithography and anisotropic etching such as RIE (Reactive Ion Etching), the interlayer insulating film 110 deposited as described above is selectively etched to form a contact hole. On this occasion, foreign matter (compounds comprising etching gas, the insulating film or constituent elements of nickel silicide film) that have been generated in the etching are allowed to remain inside the contact hole immediately after the RIE. This foreign matter can be eliminated through a treatment using a chemical liquid such as alkalized water. In this case however, the arsenic compound layer 113 is also etched away. As a result, the pocket 115 is caused to generate at the interface between interlayer insulating film 110 and the nickel silicide film 109 as shown in FIG. 3D.

Figure 3E:
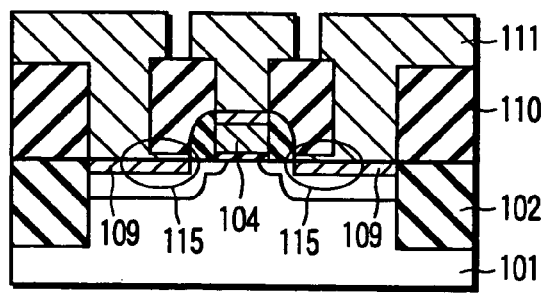

Further, when it is desired to form a wiring 111 by burying a metal film (such as TiN or W for forming wiring) in the contact hole under the aforementioned conditions by using CVD method, the metal is permitted to enter into the portion of the film-peeling 114 or into the pocket 115 as shown in FIG. 3E. Incidentally, in the case of tungsten (W) CVD, WF$_6$ gas can be employed as a source gas. When the WF$_6$ gas is employed, fluorine (F$_2$) gas is separated therefrom, thereby possibly enabling the nickel silicide film or insulating film to be etched by the fluorine gas.

Any of the aforementioned phenomena may badly affect the manufacture of the MOSFET device.

Figure 1A:
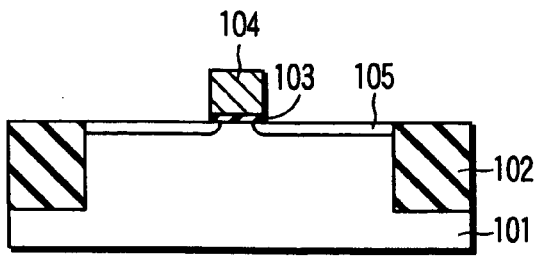
FIGS. 1A to 1F show respectively a cross-sectional view illustrating in stepwise a manufacturing method of conventional MOS type FET device.
Figure 1B:
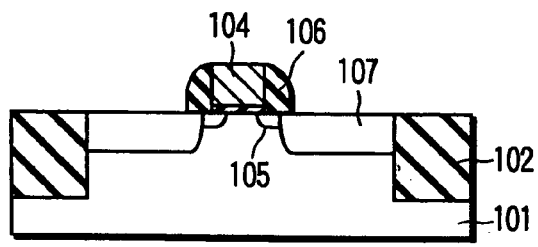
Figure 1C:
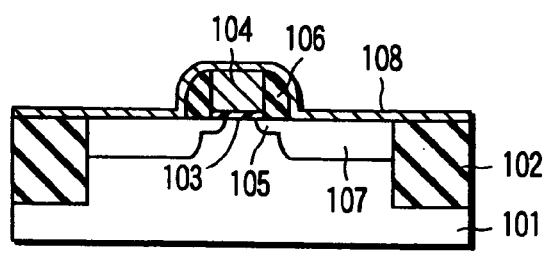
Figure 1D:
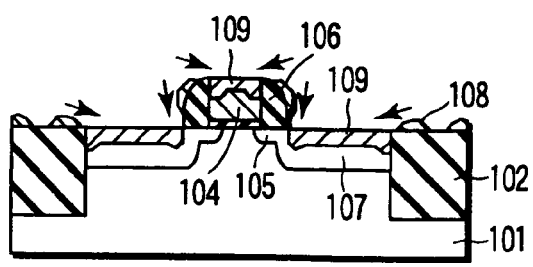
Figure 1E:
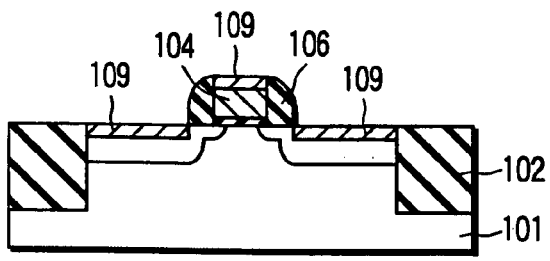
Figure 1F:
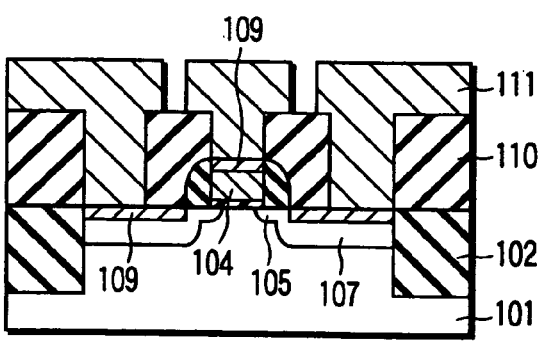
Figure 2A:
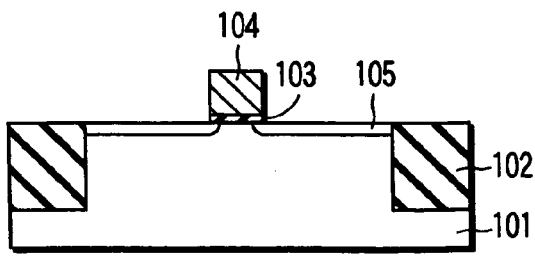
FIGS. 2A to 2G show respectively a cross-sectional view illustrating in stepwise a manufacturing method of conventional MOS type FET device.
Figure 2E:
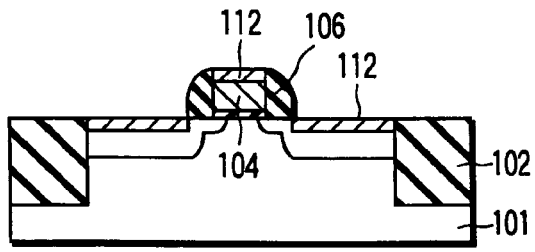
Figure 2B:
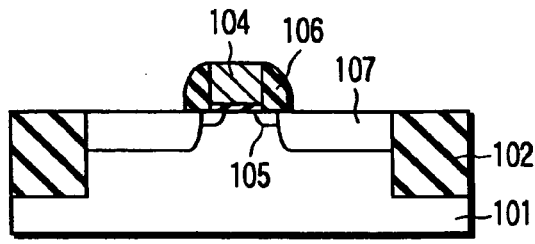
Figure 2F:
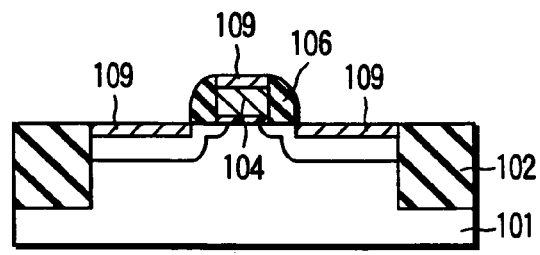
Figure 2C:
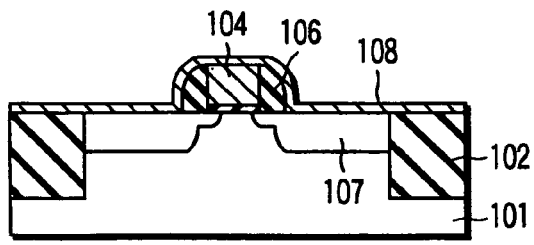
Figure 2G:
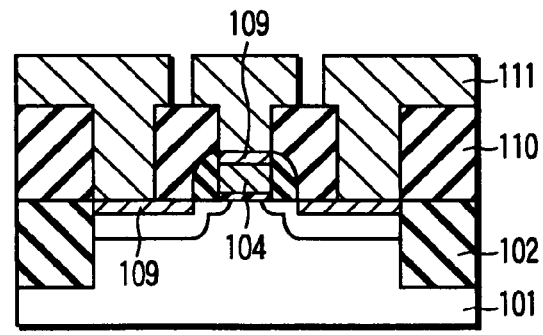
Figure 2D:
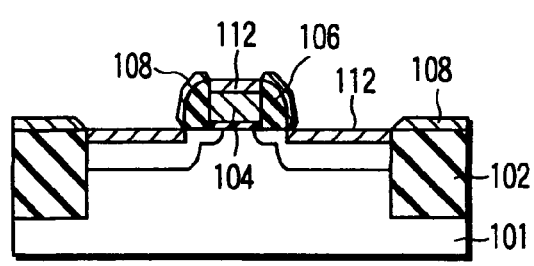

In the process of forming a nickel silicide film by a single-stage heating step also, almost the same phenomena as mentioned above may be generated depending on the selection of treating conditions. For example, in the heating process for depositing an interlayer insulating film, an arsenic compound layer may be formed on the surface of the nickel silicide film. Specifically, as shown in FIG. 1E, on the occasion of depositing an interlayer insulating film subsequent to the deposition of the nickel monosilicide film 109, an arsenic compound layer may be formed when the interlayer insulating film is heat-treated at a temperature higher than that of the short time heat treatment to be performed on the occasion of forming the silicide film. In this case, a nickel atom, silicon atom or an impurity atom such as arsenic are re-diffused into the nickel monosilicide film that has been once formed in advance. As a result, an arsenic compound is formed at an interface between the nickel monosilicide film 109 and the interlayer insulating film 110. In this manner, the peeling of interlayer insulating film 110 may be easily caused to generate or the aforementioned pocket may be caused to generate around the bottom of contact hole.

Based on the studies of the mechanism of the peeling of the interlayer insulating film or of the mechanism of generating the pocket around the bottom of contact hole as mentioned above, the present inventors have succeeded to accomplish the present invention.

Next, the method of manufacturing a semiconductor device according to one embodiment of the present invention will be explained with reference to FIGS. 4A and 4H.

Figure 4A:
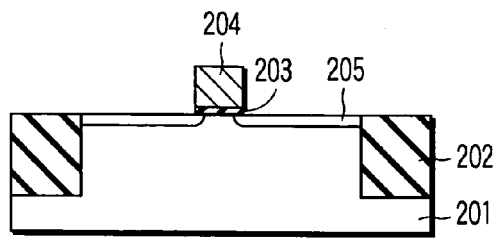
FIGS. 4A to 4H show respectively a cross-sectional view illustrating in stepwise a manufacturing method of semiconductor device according to one embodiment of the present invention.

First of all, as shown in FIG. 4A, an element isolating insulation film 202 consisting of a silicon oxide film is formed on the surface of p-type semiconductor substrate 201. Then, a polysilicon gate electrode 204 is formed in the element region of the semiconductor substrate 201 with a gate insulating film 203 being interposed between the polysilicon gate electrode 204 and the semiconductor substrate 201. By using the gate structure as a mask, arsenic (As) impurity is injected into the element region at a high concentration of $1 \times 10^{20}$ cm$^{-3}$ or more, thereby forming an n-type first diffusion region 205 on the surface region of the semiconductor substrate 201. In this case, in order to suppress any increase of parasitic resistance of the semiconductor element, arsenic is injected at a high concentration of $5 \times 10^{14}$ cm$^{-3}$ or more.

Figure 4B:
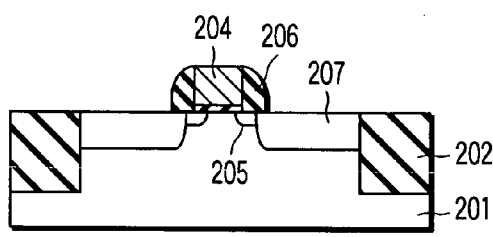

After a sidewall insulating film 206 is deposited around the gate electrode 204 as shown in FIG. 4B, a donor impurity including arsenic is injected into the semiconductor substrate 201. On this occasion also, the concentration of arsenic impurity to be injected may be as high as $2 \times 10^{15}$ cm$^{-3}$ or more. As a result, an n-type second diffusion region 207 is formed and at the same time, the donor impurity including arsenic is also introduced into the gate electrode 204, thereby turning the gate electrode 204 into an n-type polysilicon electrode.

Figure 4C:
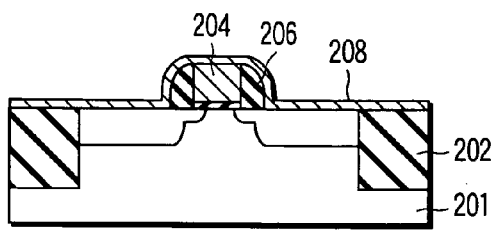

Further, as shown in FIG. 4C, a nickel film 208 is deposited all over the surface of the semiconductor substrate 201.

The semiconductor substrate having the nickel film 208 thereon is subjected to a heat treatment at a first temperature of lower than 400° C. In order to suppress the flocculation of the nickel film 208, the first temperature is required to be lower than 400° C. In order to enable the nickel to sufficiently react with silicon, the first temperature should preferably be 250° C. or more. Although the period of the heat treatment on this occasion can be optionally selected depending on the temperature of the heat treatment, a time period of not more than 5 minutes would be sufficient in general.

Figure 4D:
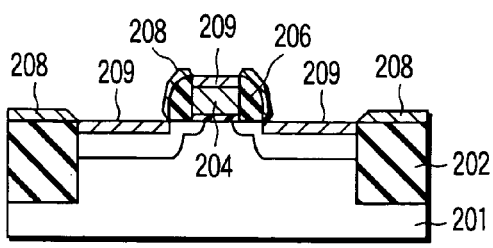

As a result of the heat treatment at the first temperature, the nickel film 208 which is contacted with the surface of the n-type gate electrode 204 that has been doped with arsenic impurity and with the surface of the n-type second diffusion region 207 is converted into a nickel-rich nickel silicide film 209 consisting of di-nickel silicide (Ni$_2$Si) or of a mixture comprising di-nickel silicide (Ni$_2$Si) and nickel monosilicide (NiSi) as shown in FIG. 4D.

Figure 4E:
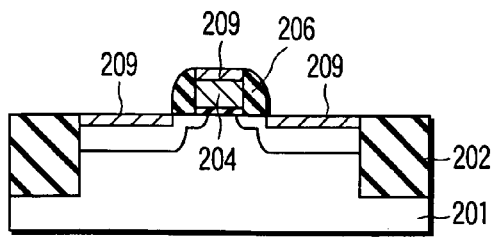

On the other hand, as shown in FIG. 4D, unreacted nickel film 208 is left remain on the surface of the element isolating insulation film 202 and on the surface of the sidewall insulating film 206. The unreacted nickel film 208 is then treated by using sulfated water or alkalized water to selectively remove it as shown in FIG. 4E.

Figure 4F:
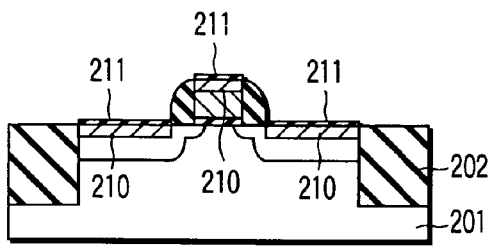

After the unreacted nickel film 208 has been removed in this manner, the resultant semiconductor substrate is further subjected to a heat treatment at a second temperature of 450° C. or more. As a result of the heat treatment at the second temperature (second heat treatment), the nickel-rich nickel silicide film 209 is turned into a nickel monosilicide (NiSi) film 210 as shown in FIG. 4F. In order to convert the nickel silicide film into the nickel monosilicide (NiSi) phase within a time period of practical RTA treatment, the nickel silicide film is required to be heated at a temperature of at least 450° C. or more. Therefore, the second temperature is regulated to 450° C. or more. In order to prevent any rise in sheet resistance on account of the flocculation of the NiSi thin film that has been formed in this manner, the second temperature should preferably be limited to 550° C. Although the period of the heat treatment on this occasion can be optionally selected depending on the temperature of the heat treatment, a time period of not more than 5 minutes would be sufficient in general.

As a result of this second heat treatment, arsenic impurity is permitted to precipitate from the second diffusion region 207, thus causing an arsenic compound layer 211 to be formed on the surface of nickel monosilicide film 210.

Figure 4G:
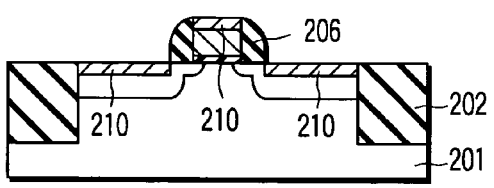
Figure 4H:
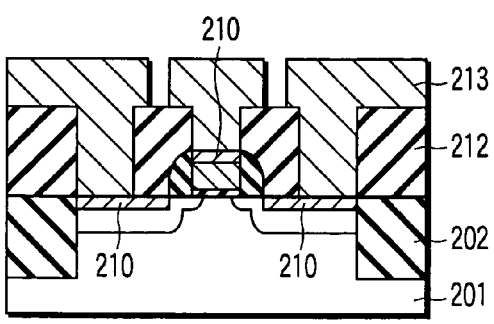

The arsenic compound layer 211 thus formed on the surface of nickel monosilicide film 210 is then treated with an alkali liquid, thereby enabling the arsenic compound layer 211 to be selectively etched away as shown in FIG. 4G.

Upon finishing the treatment with an alkali liquid, the alkali liquid should preferably be sufficiently removed by using water such as pure water.

Furthermore, an interlayer insulating film 212 is deposited all over the surface of the semiconductor substrate 201 and then subjected to photolithography and anisotropic etching such as RIE (Reactive Ion Etching) so as to form a contact hole. Finally, as shown in FIG. 4H, by this contact hole, the source, drain and gate electrode of transistor are electrically connected with a wiring layer 213 to accomplish the manufacture of a MOS type FET device.

The process subsequent to the formation of the nickel monosilicide, i.e. the heating step on the occasion of depositing the interlayer insulating film 212 as well as the heating step of forming the wiring layer 213 should preferably be performed by keeping the temperature thereof lower than the temperature of the second heat treatment. In this manner, the arsenic compound can be prevented from being re-precipitated on the surface of the nickel silicide film 210, thereby making it possible to manufacture the MOSFET device in a stable manner. More specifically, the deposition of the interlayer insulating film 212 and the formation of the wiring layer 213 should preferably be performed at a temperature of not higher than 500° C.

It was found that in the case of the MOSFET device manufactured according to the aforementioned method, the increase of the junction leak current in the source/drain diffusion layer could be confined within 5% or so. Moreover, the generation of failure of the gate insulating film was not recognized at all. As a result, it was confirmed that according to the method of this embodiment, even if arsenic impurity was employed in the formation of the source/drain diffusion layer, it was possible to form a nickel silicide film having a low electric resistance in a stable manner.

As described above, according to the embodiment of the present invention, it is possible to provide a method of manufacturing a semiconductor device, which is capable of forming a low resistance nickel silicide film in a stable manner without inviting a substantial increase of the junction leak current at the source/drain diffusion layer containing a high concentration of arsenic impurity.

According to the present invention, it is possible to expect stable improvement in performance of a semiconductor device, and therefore, the present invention would be very valuable from an industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
   forming a diffusion region by introducing an arsenic impurity into an element region of a silicon substrate, which is isolated by an element isolating insulation film, to a concentration of $1 \times 10^{20}$ cm$^{-3}$ or more with a gate electrode formed over a gate insulating film being employed as a mask;
   depositing nickel metal over the entire top surface of the silicon substrate;
   heat-treating said silicon substrate having said nickel metal deposited thereon at a first temperature of less than 400° C. while leaving said nickel metal on the surface of said element isolating insulation film, thereby forming a nickel silicide film containing di-nickel silicide (Ni$_2$Si) on a surface of said the diffusion region;
   removing an unreacted portion of said nickel metal deposited on said element isolating insulation film;

heat-treating said silicon substrate having said unreacted nickel metal removed therefrom at a second temperature of 450° C. or more, thereby forming a nickel monosilicide (NiSi) film having an arsenic compound layer on a surface thereof;

etching away said arsenic compound layer by using an alkaline liquid;

depositing an interlayer insulating film over the entire top surface of said silicon substrate; and forming a wiring layer piercing through said interlayer insulating film.

2. The method of manufacturing a semiconductor device according to claim 1, wherein said alkaline liquid comprises a mixed solution containing aqueous ammonia and aqueous hydrogen peroxide.

3. The method of manufacturing a semiconductor device according to claim 1, wherein said alkaline liquid is a mixed solution containing choline and aqueous hydrogen peroxide.

4. The method of manufacturing a semiconductor device according to claim 1, wherein said first temperature is 250° C. or more.

5. The method of manufacturing a semiconductor device according to claim 1, wherein said second temperature is 550° C. or less.

6. The method of manufacturing a semiconductor device according to claim 1, wherein heat-treating at said first temperature is performed for a period of less than five minutes.

7. The method of manufacturing a semiconductor device according to claim 1, wherein heat-treating at said second temperature is performed for a period of less than five minutes.

8. The method of manufacturing a semiconductor device according to claim 1, wherein depositing said interlayer insulating film and forming said wiring layer are performed at a temperature lower than said second temperature.

9. The method of manufacturing a semiconductor device according to claim 1, wherein depositing said interlayer insulating film and forming said wiring layer are performed at a temperature of 500° C. or less.

10. A method of manufacturing a semiconductor device comprising:

forming a diffusion region by introducing arsenic impurity into an element region of a silicon substrate, which is isolated by an element isolating insulation film, to a concentration of $1 \times 10^{20}$ $cm^{-3}$ or more with a gate electrode formed over a gate insulating film being employed as a mask;

depositing a metal film over the entire top surface of said silicon substrate;

heat-treating said silicon substrate having said metal film deposited thereon at a first temperature of less than 400° C. while leaving said metal film on the surface of said element isolating insulation film, thereby forming a first metal silicide film on a surface of said diffusion region;

removing an unreacted portion of said metal film deposited on said element isolating insulation film;

heat-treating said silicon substrate having said unreacted metal film removed therefrom at a second temperature of 450° C. or more, thereby forming a second metal silicide film having a arsenic compound layer on a surface thereof;

etching away said arsenic compound layer by using an alkaline liquid;

depositing an interlayer insulating film over the entire top surface of said silicon substrate; and forming a wiring layer piercing through said interlayer insulating film.

11. The method of manufacturing a semiconductor device according to claim 10, wherein said metal film is a nickel film, said first metal silicide is di-nickel silicide ($Ni_2Si$), and said second metal silicide is nickel monosilicide (NiSi).

12. The method of manufacturing a semiconductor device according to claim 10, wherein said alkaline liquid comprises a mixed solution containing aqueous ammonia and aqueous hydrogen peroxide.

13. The method of manufacturing a semiconductor device according to claim 10, wherein said alkaline liquid is a mixed solution containing choline and aqueous hydrogen peroxide.

14. The method of manufacturing a semiconductor device according to claim 10, wherein said first temperature is 250° C. or more.

15. The method of manufacturing a semiconductor device according to claim 10, wherein said second temperature is 550° C. or less.

16. The method of manufacturing a semiconductor device according to claim 10, wherein heat-treating at said first temperature is performed for a period of less than five minutes.

17. The method of manufacturing a semiconductor device according to claim 10, wherein heat-treating at said second temperature is performed for a period of less than five minutes.

18. The method of manufacturing a semiconductor device according to claim 10, wherein depositing said interlayer insulating film and forming said wiring layer are performed at a temperature lower than said second temperature.

19. The method of manufacturing a semiconductor device according to claim 10, wherein depositing said interlayer insulating film and forming said wiring layer are performed at a temperature of 500° C. or less.

* * * * *